(12) United States Patent
Sugiyama et al.

(10) Patent No.: US 10,649,262 B2
(45) Date of Patent: May 12, 2020

(54) ELECTRONIC APPARATUS, METHOD OF PRODUCING ELECTRONIC APPARATUS, AND SUBSTRATE LAMINATE

(71) Applicant: Sony Corporation, Tokyo (JP)

(72) Inventors: Koichi Sugiyama, Aichi (JP); Akihiro Konno, Jiangsu (JP); Fei Zeng, Jiangsu (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/076,834

(22) PCT Filed: Feb. 16, 2016

(86) PCT No.: PCT/JP2016/000788
§ 371 (c)(1),
(2) Date: Aug. 9, 2018

(87) PCT Pub. No.: WO2017/141285
PCT Pub. Date: Aug. 24, 2017

(65) Prior Publication Data
US 2019/0049769 A1    Feb. 14, 2019

(51) Int. Cl.
*G02F 1/1333*    (2006.01)
*B32B 7/12*    (2006.01)
(Continued)

(52) U.S. Cl.
CPC ............ *G02F 1/13338* (2013.01); *B32B 7/12* (2013.01); *B32B 27/08* (2013.01);
(Continued)

(58) Field of Classification Search
CPC ...... H05K 5/0217; H05K 5/03; H05K 5/0017; H05K 2201/09036; H05K 2201/09845;
(Continued)

(56) References Cited

U.S. PATENT DOCUMENTS

2009/0066862 A1*  3/2009  Ishii ................. G02F 1/133308
                                                                          349/12
2012/0052633 A1*  3/2012  Sakemi ............ H01L 23/49811
                                                                          438/118
(Continued)

FOREIGN PATENT DOCUMENTS

JP    2009-069321 A    4/2009
JP    2011-209590 A    10/2011
(Continued)

OTHER PUBLICATIONS

International Search Report and English translation thereof dated Apr. 19, 2016 in connection with International Application No. PCT/JP2016/000788.
(Continued)

*Primary Examiner* — James Wu
(74) *Attorney, Agent, or Firm* — Wolf, Greenfield & Sacks, P.C.

(57) ABSTRACT

[Object] To provide an electronic apparatus that can prevent defects caused by a seepage of ultraviolet curable resin, a method of bonding the electronic apparatus, and a substrate laminate.
[Solving Means] An electronic apparatus according to an embodiment of the present technology includes a translucent substrate, a display panel, a first bond layer, and a guard. The translucent substrate has a first surface, a second surface opposite to the first surface, and a frame-shaped coating arranged at a periphery of the first surface. The display panel has a display surface faced to the first surface. The first bond layer bonds the first surface and the display surface together, coats an inner periphery of the coating, and is made of a cured product of light-curable resin. The guard is arranged on the coating along at least a part of a periphery of the first bond layer and has a structural surface with lower wettability to the light-curable resin than that of the coating.
[Selected Drawing] FIG. 2

17 Claims, 6 Drawing Sheets

(51) Int. Cl.
  *B32B 27/08* (2006.01)
  *G02F 1/1335* (2006.01)
  *H01L 27/32* (2006.01)
  *H01L 51/52* (2006.01)
  *H01L 51/56* (2006.01)
  *H05K 5/00* (2006.01)

(52) U.S. Cl.
  CPC .. *G02F 1/133308* (2013.01); *G02F 1/133512* (2013.01); *H01L 27/323* (2013.01); *H01L 51/5246* (2013.01); *H01L 51/5284* (2013.01); *H01L 51/56* (2013.01); *H05K 5/0017* (2013.01); *B32B 2307/414* (2013.01); *B32B 2457/202* (2013.01); *B32B 2457/206* (2013.01); *G02F 2001/133325* (2013.01); *G02F 2202/28* (2013.01)

(58) Field of Classification Search
  CPC .. H05K 3/305; B29D 11/00009; G02B 7/025; G06F 1/169; G06F 2200/1612; G06F 1/1626; G06F 1/1637; G06F 1/1601; G02F 2001/133331; G02F 1/133308; G02F 2202/28; G02F 2202/023; B29K 2995/0026; B29K 2709/08; B29K 2995/0037; B29L 2031/3475; B29L 2031/3481; B29L 2011/0016; B29C 2045/14327; B29C 45/14778; B29C 45/14434; B29C 45/14336; B29C 45/14311; H04M 1/185; H04M 1/03; H04M 1/026; H04M 1/0266; H04M 1/0252; H01L 51/5246; H01L 51/524; B32B 2037/1253
  See application file for complete search history.

(56) References Cited

U.S. PATENT DOCUMENTS

| | | | | |
|---|---|---|---|---|
| 2012/0098426 | A1* | 4/2012 | Lee | H01L 51/524 315/51 |
| 2014/0078585 | A1* | 3/2014 | Kim | G09F 9/33 359/513 |
| 2014/0293211 | A1* | 10/2014 | Terao | G02F 1/1339 349/153 |
| 2015/0355498 | A1 | 12/2015 | Yoshida et al. | |
| 2016/0039179 | A1* | 2/2016 | Yoshida | B32B 7/12 428/189 |

FOREIGN PATENT DOCUMENTS

| | | | |
|---|---|---|---|
| JP | 2013-195806 | A | 9/2013 |
| JP | 2013-257480 | A | 12/2013 |
| JP | 2014-182163 | A | 9/2014 |
| JP | 2014-223759 | A | 12/2014 |
| JP | 2015-126347 | * | 7/2015 |
| JP | 2015-126347 | A | 7/2015 |
| JP | 2015-232656 | A | 12/2015 |
| JP | 2016-038559 | A | 3/2016 |

OTHER PUBLICATIONS

International Written Opinion dated Apr. 19, 2016 in connection with International Application No. PCT/JP2016/000788, and English translation thereof.
International Preliminary Report on Patentability dated Aug. 30, 2018 in connection with International Application No. PCT/JP2016/000788, and English translation thereof.
Extended European Search Report dated Dec. 13, 2018 in connection with European Application No. 16890428.2.
Japanese Office Action dated Jan. 14, 2020, in connection with Japanese Application No. 2017-567565 and English translation thereof.

* cited by examiner

ELECTRONIC APPARATUS, METHOD OF PRODUCING ELECTRONIC APPARATUS, AND SUBSTRATE LAMINATE

CROSS-REFERENCE TO RELATED APPLICATIONS

This Application is a national stage filing under 35 U.S.C. 371 of International Patent Application Serial No. PCT/JP2016/000788, filed in the Japan Patent Office on Feb. 16, 2016, the entire contents of which is incorporated herein by reference in its entirety.

TECHNICAL FIELD

The present technology relates to an electronic apparatus having a bond layer including light-curable resin, a method of producing the electronic apparatus, and a substrate laminate.

BACKGROUND ART

In the electronic apparatus art of a smartphone, a digital still camera, and the like, ultraviolet curable resin is widely used for laminate adhesion of a display panel such as a liquid crystal display panel, a touch panel having a touch sensor, a transparent protection plate for protecting them, or the like.

For example, Patent Literature 1 discloses an electronic apparatus using ultraviolet curable resin for bonding a display panel and a touch panel. In addition, Patent Literature 2 discloses a display module using ultraviolet curable resin for bonding a touch panel and a transparent protection plate.

CITATION LIST

Patent Literature

Patent Literature 1: Japanese Patent Application Laid-open No. 2013-257480
Patent Literature 2: Japanese Patent Application Laid-open No. 2011-209590

DISCLOSURE OF INVENTION

Technical Problem

In a case where ultraviolet curable resin is used to bond a display panel and a touch panel, the ultraviolet curable resin is applied and semi-cured on a bond surface of the touch panel, the display panel is adhered to the bond surface, and the ultraviolet curable resin is further cured, for example. At this time, an uncured component of the ultraviolet curable resin may seep out on the bond surface of the touch panel, which may cause appearance or functional defects. For example, in a case where a coating such as a light shielding layer is formed on the bond surface, the coating may be altered or degraded due to contact with the uncured component, which may result in a poor appearance of the device.

The present technology is made in view of the above-mentioned circumstances, and it is an object of the present technology to provide an electronic apparatus that can prevent defects caused by a seepage of ultraviolet curable resin, a method of bonding the electronic apparatus, and a substrate laminate.

Solution to Problem

An electronic apparatus according to an embodiment of the present technology includes a translucent substrate, a display panel, a first bond layer, and a guard.

The translucent substrate has a first surface, a second surface opposite to the first surface, and a frame-shaped coating arranged at a periphery of the first surface.

The display panel has a display surface faced to the first surface.

The first bond layer bonds the first surface and the display surface together, coats an inner periphery of the coating, and is made of a cured product of light-curable resin.

The guard is arranged on the coating along at least a part of a periphery of the first bond layer and has a structural surface with lower wettability to the light-curable resin than that of the coating.

Since the leakage of the light-curable resin is guarded by the guard, the electronic apparatus can effectively prevent defects such as degradation of the coating.

The guard is typically arranged between the inner periphery and an outer periphery of the coating. In this case, the electronic apparatus may further include a housing and a second bond layer.

The housing has a storage that stores the display panel, and a bond surface that is arranged around the storage and is faced to the outer periphery of the coating. The second bond layer bonds the outer periphery of the coating and the bond surface together.

Since the guard is arranged between the inner periphery and the outer periphery of the coating, leakage of the light-curable resin to a bonding region of the housing and the translucent substrate can be inhibited and bond reliability between the housing and the translucent substrate is thereby ensured.

The guard may include an applied film of ink with lower wettability to the light-curable resin than that of the coating. In this case, the guard may include the applied film having a color different from that of the coating. This allows visibility of the applied film on the coating to be enhanced to determine presence or absence of the applied film.

Alternatively, the guard may include a groove or a roughened surface arranged on the coating. Furthermore, the guard may include a protrusion arranged on the coating.

The coating may include a light shielding layer that shields a periphery of the display surface viewed from the second surface. With this structure, expected light shielding properties can be stably maintained.

The translucent substrate may include a touch panel having a touch sensor.

An electronic apparatus according to another embodiment of the present technology includes a translucent first substrate having a first bond surface, a second substrate faced to the first bond surface, a housing, a first bond layer, a second bond layer, and a guard.

The housing has a storage that stores the second substrate, and a second bond surface that is arranged around the storage and is faced to an outer periphery of the first bond surface.

The first bond layer bonds the first substrate and the second substrate together and is made of a cured product of a light-curable resin.

The second bond layer bonds the outer periphery of the first bond surface and the second bond surface together.

The guard is arranged on the first bond surface along at least a part of the periphery of the first bond layer and has a structural surface with lower wettability to the light-curable resin than that of the first bond surface.

A method of producing an electronic apparatus according to an embodiment of the present technology includes forming a frame-shaped coating at a periphery of a first surface of a translucent substrate.

A guard having a structural surface with lower wettability to light-curable resin than that applied to the first surface is formed at at least a part between an inner periphery and an outer periphery of the coating.

The light-curable resin is applied on the first surface of the coating at an inner periphery side.

A display panel is bonded to the first surface via the light-curable resin.

The light-curable resin is cured by irradiating the light-curable resin with light from a second surface opposite to the first surface.

The step of forming the guard may include forming an applied film with lower wettability to the light-curable resin than that of the coating.

In this case, the step of forming the guard may forming the applied film having a color different from that of the coating.

The production method may further include bonding the translucent substrate to the housing via an adhesive layer formed around an entire periphery of the outer periphery of the coating.

A substrate laminate according to an embodiment of the present technology includes a translucent first substrate having a bond surface, a second substrate faced to the first bond surface, a bond layer, and a guard.

The bond layer bonds the first substrate and the second substrate together and is made of a cured product of a light-curable resin.

The guard is arranged on the bond surface along at least a part of the periphery of the bond layer and has a structural surface with lower wettability to the light-curable resin than that of the bond surface.

The first substrate may include a coating arranged on a periphery of the bond surface. In this case, a periphery of the bond layer coats an inner periphery of the coating. The guard has a structural surface with lower wettability to the light-curable resin than that of the coating and is arranged between an inner periphery and an outer periphery of the coating.

Advantageous Effects of Invention

As described above, according to the present technology, defects caused by a seepage of the ultraviolet curable resin can be prevented.

It should be noted that the effects described here are not necessarily limitative and may be any of effects described in the present disclosure.

MODE(S) FOR CARRYING OUT THE INVENTION

Hereinafter, embodiments of the present technology will be described with reference to the drawings.

First Embodiment

Figure 1:
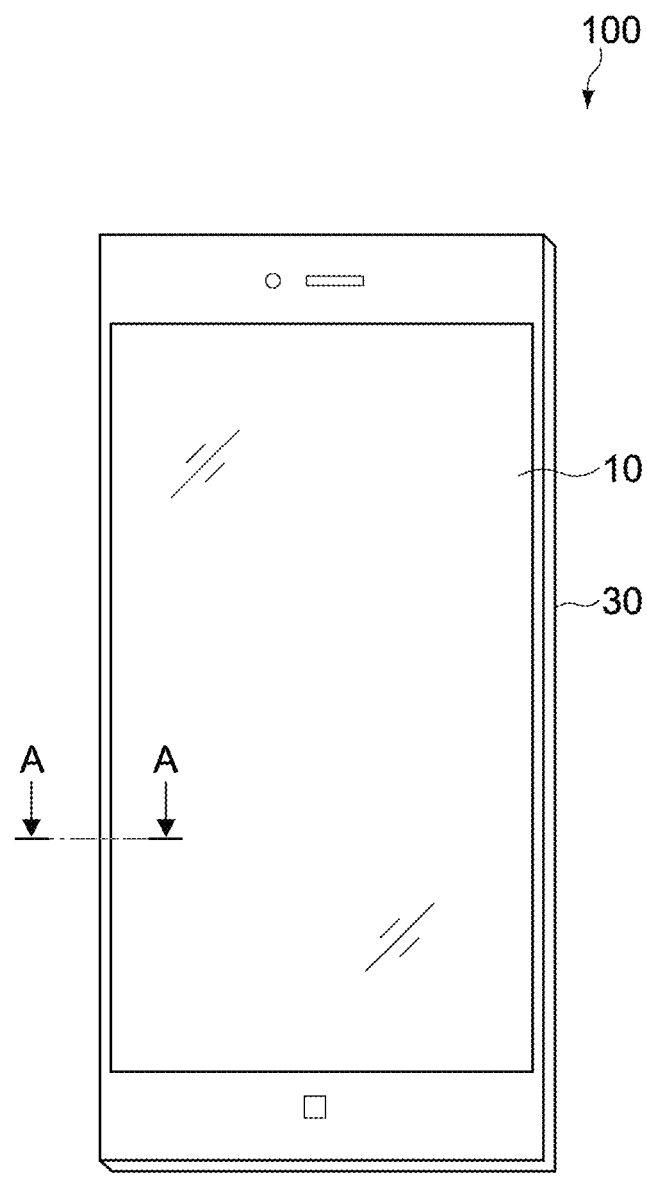
FIG. 1 is a schematic overall view of an electronic apparatus according to a first embodiment of the present technology.
Figure 1:
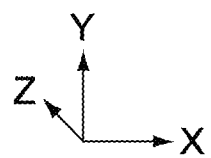
Figure 2:
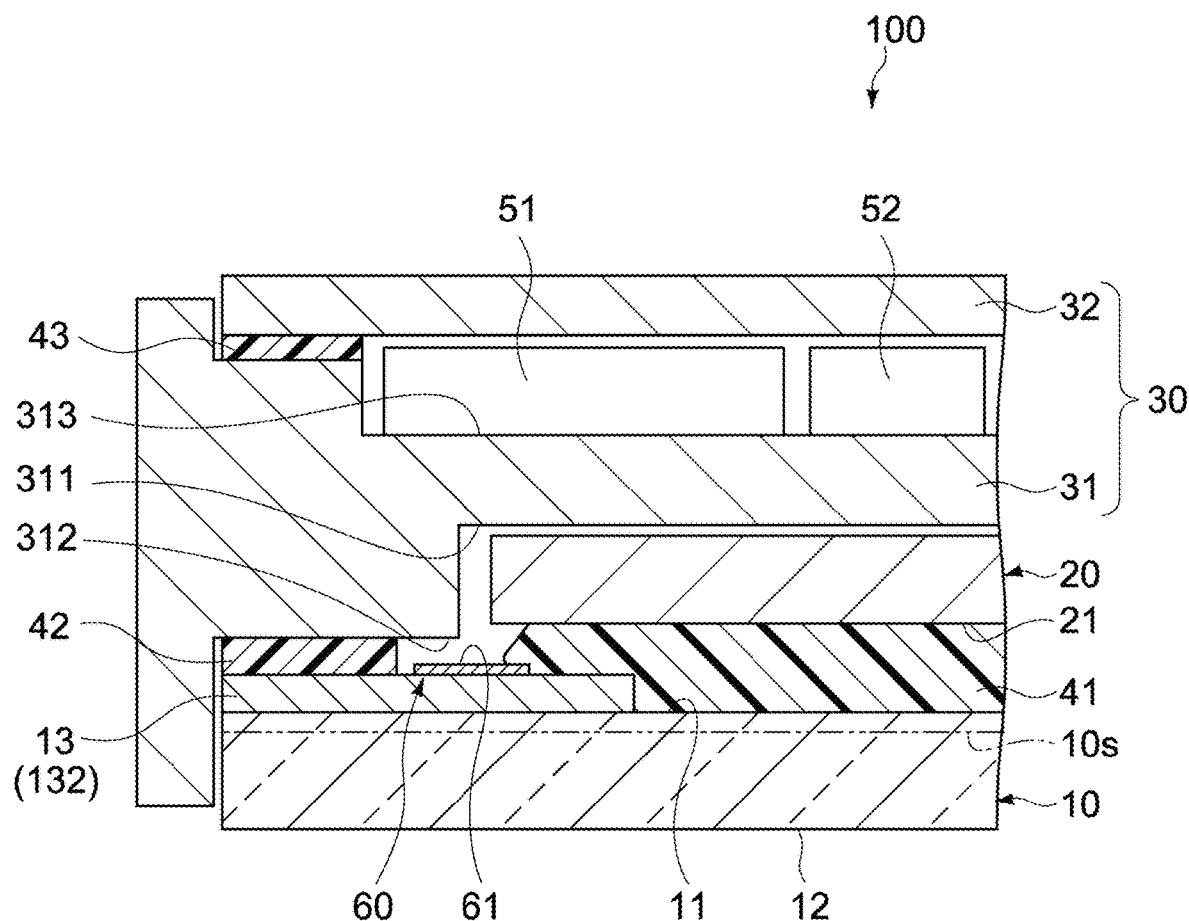
FIG. 2 is a sectional view taken along the line A-A of FIG. 1.

FIG. 1 is a schematic overall view of an electronic apparatus according to the present technology and FIG. 2 is a sectional view taken along the line A-A of FIG. 1. In this embodiment, a smartphone is illustrated as an example of the electronic apparatus.

Note that in each figure, the X axis, the Y axis, and the Z axis show the three-axis directions orthogonal to each other. The X axis corresponds to the vertical direction of the apparatus, the Y axis corresponds to the horizontal direction (longitudinal direction) of the apparatus, and the Z axis corresponds to the thickness direction of the apparatus, respectively. (The same applies to each figure shown later.)

[Overall Structure]

An electronic apparatus 100 according to this embodiment includes a touch panel 10, a display panel 20, and a first bond layer 41 that bonds the touch panel 10 and the display panel 20.

In addition, the electronic apparatus 100 includes a housing 30 that houses the display panel 20 and a second bond layer 42 that bonds the touch panel 10 and the housing 30.

The touch panel 10 includes a translucent substrate made of rectangular glass or plastic having a touch sensor 10s. The touch panel 10 is bonded to a display surface 21 of the display panel 20 and functions as an input device operable by a user. The touch sensor 10s is typically an electrostatic capacitive type touch sensor but may also be other types of sensor including a resistive membrane type, a surface acoustic wave type, and an infrared type.

The touch panel 10 has a bond surface 11 (first bond surface or first surface) bonded to the display panel 20 and an input operation surface 12 (second surface) operable by the user. In this embodiment, the touch sensor 10s includes a translucent sensor sheet on which a plurality of capacitive elements are arranged in a matrix and is arranged at a bond surface 11 side of the touch panel 10.

The touch panel 10 includes a frame-shaped coating 13 arranged at a periphery of the bond surface 11. The coating 13 has a function as a decorative layer that enhances designability of the touch panel 10 and has a function as a light shielding layer or a shielding layer that shields a wiring region of the touch sensor 10s, a non-display region (invalid region) at a periphery of the display panel 20, and the like.

The coating 13 is typically a print layer but may be an applied film, a deposited film, a sheet or a tape adhered to the bond surface 11, or the like. The coating 13 may have any color of which is not especially limited and may be an achromatic color such as block and white, a chromatic color such as red and blue, as well as a metallic color such as gold and silver and may include an image, a character, a pattern, or the like.

The display panel 20 is a display device such as a liquid crystal display device and an organic EL (electroluminescence) device. The display panel 20 is typically formed in a rectangular shape having dimensions in the horizontal and vertical directions smaller than those of the touch panel 10. The display surface 21 of the display panel 20 is faced to the bond surface 11 of the touch panel 10 and the display surface 21 and the bond surface 11 are bonded together via the first bond layer 41.

The housing 30 includes a first housing 31 and a second housing 32.

The first housing 31 forms a main part of the housing 30 and supports a control substrate 51 that controls a device main body including the touch panel 10 and the display panel 20, a communication module, a battery 52, and the like. The first housing 31 is formed of plastic, metal, or a composite thereof and is typically formed of a rectangular plate-shaped injection molded product made of a plastic material.

The first housing 31 includes a first storage 311 and a bond surface 312 (second bond surface). The storage 311 is a roughly rectangular recess arranged on a main surface of the first housing 31 at one side and has a depth dimension that can houses the display panel 20. The bond surface 312 is arranged around the first storage 311 and faces to an outer periphery of the bond surface 11 of the touch panel 10. The bond surface 312 of the first housing 31 and the bond surface 11 of the touch panel 10 are bonded together via the second bond layer 42.

On a main surface of the first storage 31 at the other side, a second storage 313 is arranged. The second storage 313 is a roughly rectangular recess having a depth dimension that can houses the control substrate 51 and the battery 52. The second housing 32 is arranged on the electronic apparatus 100 at a rear side, functions as a lid covering the second storage 313, and is bonded to the first housing 31 via an adhesive layer 43.

The first bond layer 41 is made of a cured product of light-curable resin, typically, ultraviolet curable resin. The first bond layer 41 bonds the bond surface 11 of the touch panel 10 and the display surface 21 of the display panel 20 together. The first bond layer 41 entirely coats the display surface 21 of the display panel 20 and the periphery of the first bond layer 41 partly coats the inner periphery of the coating 13.

On the other hand, the second bond layer 42 is formed in a frame shape at the periphery of the touch panel 10 and bonds the outer periphery of the bond surface 11 of the touch panel 10 and the bond surface 312 of the housing 30 (first housing 31) together. In this embodiment, since the outer periphery of the bond surface 11 of the touch panel 10 is covered with the coating 13, the second bond layer 42 is configured to bond the outer periphery of the coating 13 and the bond surface 312 of the housing 30 together. The second bond layer 42 is formed of a waterproof adhesive agent or an adhesive tape and protects and shuts off the display panel 20 and touch sensor 10s from outside air.

In this embodiment, as described later, the touch panel 10 and the display panel 20 are bonded by applying and semi-curing ultraviolet curable resin to the bond surface 11 of the touch panel 10, adhering the display panel 20 to the bond surface 11, and curing the ultraviolet curable resin. At this time, an uncured component (low molecular weight component) of the ultraviolet curable resin may seep out on the coating 13 to alter or degrade the coating 13. Alternatively, the uncured component may spread and wet over the coating 13 and reach a bonded region of the second bond layer 42. The alternation or the degradation of the coating 13 due to contact with the uncured component may lower a shielding function of the coating 13, which results in a poor appearance. Also, adhesion to the second bond layer 42 may be lowered, which decreases bond reliability, e.g., waterproof.

Thus, the electronic apparatus 100 according to this embodiment includes a guard 60 in order to prevent appearance or functional defects caused by a seepage of the ultraviolet curable resin.

As shown in FIG. 2, the guard 60 is arranged on the coating 13 along at least a part of the periphery of the first bond layer 41. The guard 60 has a structural surface 61 with lower wettability to the light-curable resin of the first bond layer 41 than that of the coating 13.

Since the guard 60 has the structural surface 61 with lower wettability to the light-curable resin than that of the coating 13, the uncured component seeped out from the first bond layer 41 less wets the structural surface 61 and the uncured component is inhibited from getting over the structural surface 61 and from leaking out to an outer periphery side of the coating 13. Thus, the alternation or the degradation of the coating 13 positioned outside the structural surface 61 are prevented. Shielding properties or light shielding properties of the coating 13 is prevented from lowering and the bond reliability between the second bond layer 42 and coating 13 is ensured.

The guard 60 is arranged between the inner periphery and the outer periphery of the coating 13. Specifically, the guard 60 is arranged between the inner periphery of the coating 13 and a forming region of the second bond layer 42.

As shosn in FIG. 2, the guard 60 is arranged at the position where a part of the structural surface 61 can be coated with the first bond layer 41. In this manner, as compared with the case that no guard 60 is provided, the uncured component spread from the periphery of the first bond layer 41 can be guarded. Thus, a bonding region of the second bond layer 42 positioned outside the guard 60 is protected from being in contact with the ultraviolet curable resin and it ensures the adhesion to the second bond layer 42.

Figure 3:
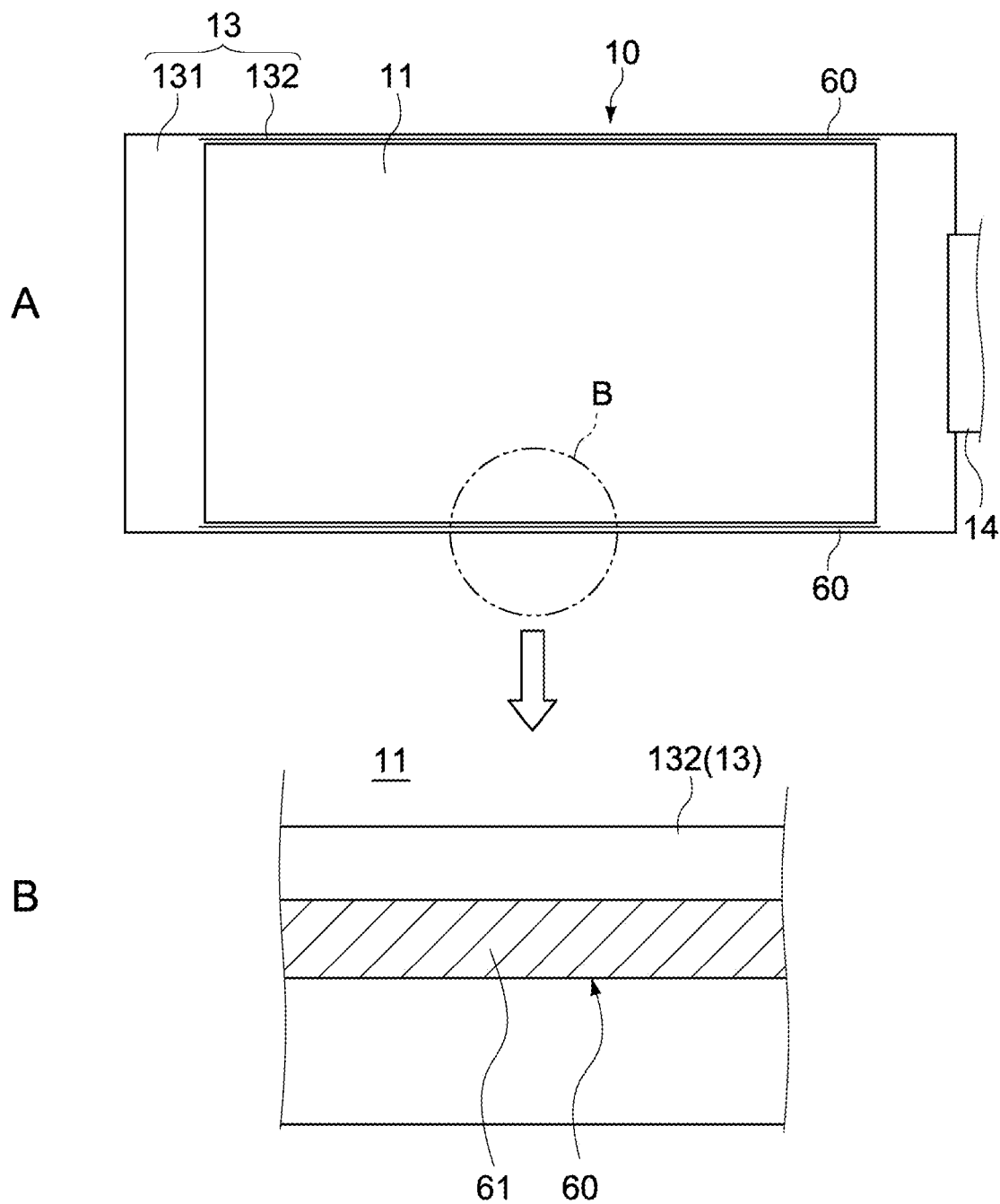
FIG. 3 is a back view of a touch panel of the electronic apparatus where A is an overall view and B is an enlarged view of a B portion of A.

FIG. 3A is a plan view of the touch panel 10 at the bond surface 11 side and FIG. 3B is an enlarged view of a B portion of FIG. 3A.

As shown in FIG. 3A, the coating 13 is arranged in a frame shape at the periphery of the bond surface 11 of the touch panel 10. In this embodiment, the coating 13 is formed such that regions 132 that coat long two sides of the touch panel 10 have widths narrower than those of regions 131 that coat short two sides thereof. Note that a reference sign 14 in FIG. 3A denotes a flexible wiring board attached to the touch sensor 10s and is connected to the control substrate 51 via the first housing 31.

On the other hand, each guard 60 is arranged linearly on the coating 13 at the region 132 of a long side of the touch panel 10. Accordingly, in this embodiment, the guards 60 are arranged on the coating 13 along the regions faced to the long two sides of the touch panel 10 of the periphery of the first bond layer 41.

Note that it is not limited to the example and the guard 60 may be arranged in a frame shape on the coating 13 including the short side regions 131. In this case, the guard 60 will be arranged on the coating 13 along the entire periphery of the first bond layer 41.

In addition, as shown in FIG. 2 and FIG. 3B, the guard 60 is arranged slightly near the inner periphery of the coating 13 with respect to the center in the width direction of the region 132 of the coating 13. This allows a sufficient forming region of the second bond layer 42 at the outer periphery of the region 132. In addition, since a part of the inner periphery of the guard 60 is coated with the periphery of the first bond layer 41, a bond area of the touch panel 10 and the display panel 20 via the first bond layer 41 can be as wide as possible, to thereby enhancing bond quality of the both panels.

The structure of the guard 60 is not especially limited. In this embodiment, the guard 60 includes an applied film of ink with lower wettability to the light-curable resin than that of the coating 13. The ink type of the guard 60 is not especially limited and is typically oily marking ink. Among them, the ink to be used has wettability of the light-curable resin of the first bond layer 41 toward the surface applied and dried (structural surface 61) is lower than wettability of the light-curable resin toward the surface of the coating 13.

For example, in a case where ultraviolet curable resin (photoelastic resin) is used as the light-curable resin, a dyne value (wettability evaluation value) of the guard 60 (structural surface 61) is preferably 32 or more and less than 38. In a case where the dyne value is less than 32, the wettability is very poor and it is difficult coat the inner periphery of the guard 60 at the periphery of the first bond layer 41 as shown in FIG. 2. On the other hand, in a case where the dyne value is 38 or more, it is difficult that the structural surface 61 effectively inhibits the uncured component of the light-curable resin from wetting and spreading.

Note that in a case where the sufficient bond area of the touch panel 10 and the display panel 20 via the first bond layer 41 is ensured, the region of the guard 60 at an inner periphery side may not be coated with the first bond layer 41. In this case, the ink of the guard 60 may have the dyne value of less than 32.

The thickness of the guard 60 is not especially limited. With some thickness, the forming region of the guard 60 on the coating 13 can have levels. By using the levels, the uncured component seeped out from the first bond layer 41 can be dammed back. In this case, the surfaces of the levels also function as a part of the structural surface 60.

The guard 60 is formed at a predetermined position of the coating 13 by using an appropriate technique including printing, transferring, and application. In this case, the guard 60 may include an applied film having a color different from that of the coating 13. This allows visibility of the applied film on the coating 13 to be enhanced to determine presence or absence of the applied film.

[Method of Producing Electronic Apparatus]

Next, a method of producing the electronic apparatus 100 according to this embodiment will be described.

FIGS. 4A to D are schematic cross-sectional views of a main part of the electronic apparatus 100 showing a method of producing the electronic apparatus 100, in particular, a substrate laminate made by bonding the touch panel 10 and the display panel 20.

Figure 4:
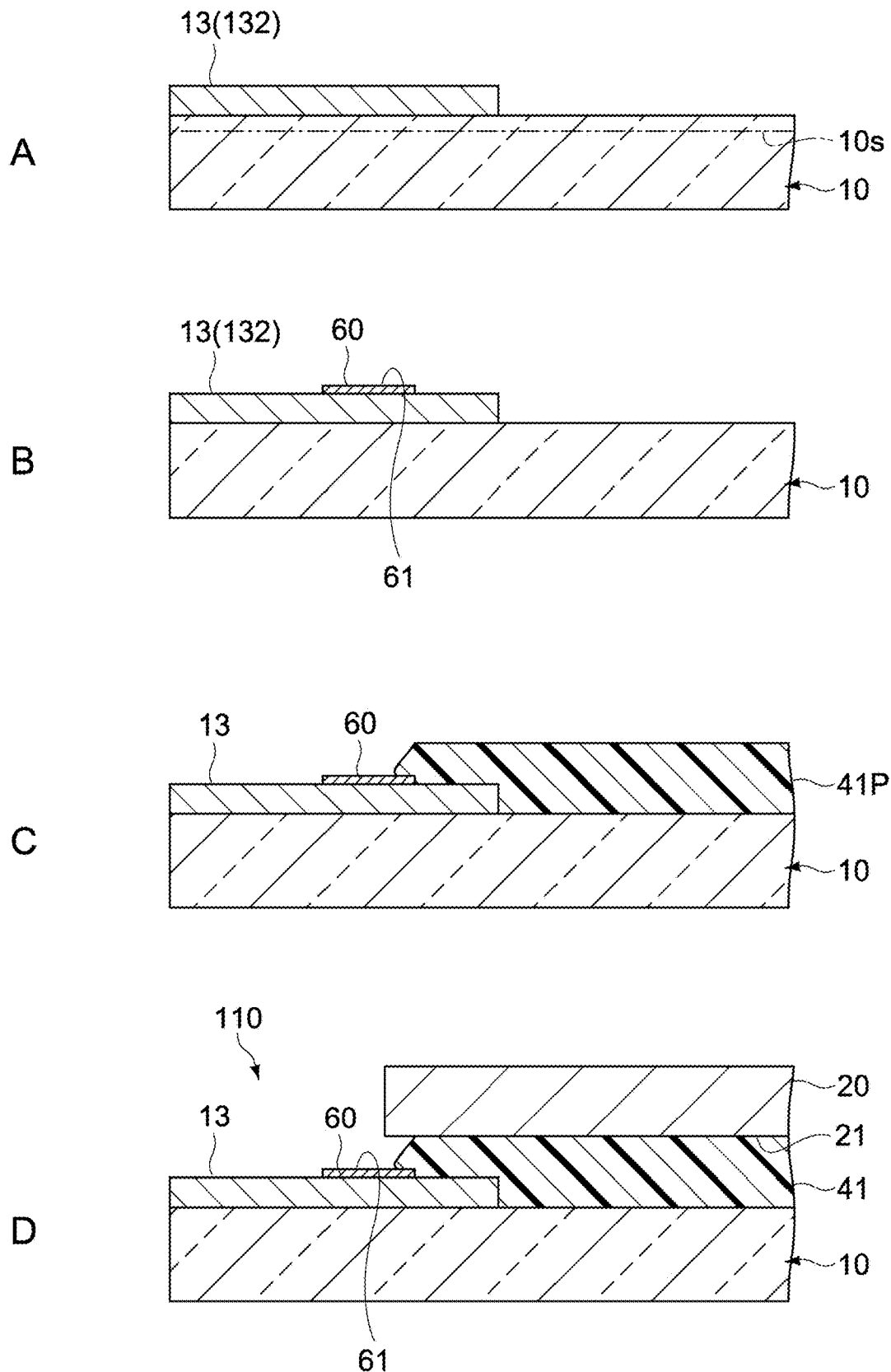
FIG. 4 is schematic cross-sectional views of a main part of the electronic apparatus for illustrating a method of producing the electronic apparatus.

First, as shown in FIG. 4A, the frame-shaped coating 13 is formed at the periphery of the bond surface 11 (first surface) of the touch panel 10 (translucent substrate).

Next, as shown in FIG. 4B, the guard 60 having the structural surface 61 with lower wettability to the light-curable resin than that applied to the bond surface 11 (ultraviolet curable resin of the first bond layer 41) is formed at at least a part between the inner periphery and the outer periphery of the coating 13. In this embodiment, as described above, the applied film having the wettability to the light-curable resin lower than that of the coating 13 is formed on the coating 13 as the guard 60. The method of forming the applied film is not especially limited and includes drawing with a maker pen, an inkjet head, a stencil mask, or the like, application, printing, and the like.

As an example, the guard 60 having a width of 0.3 to 0.6 mm is formed on the region 132 of the coating 13 having a width of 1.5 to 1.9 mm. In addition, a waterproof region (forming region of the second bond layer 42) having a width of about 0.7 mm is set between the outer periphery of the region 132 and the outer periphery of the guard 60.

Furthermore, since the applied film of a paint having a color different from that of the coating 13 is used as the guard 60, presence or absence of the guard 60 on the above-described narrow region 132 is easily visually determined. Thus, the workability can be improved.

Next, as shown in FIG. 4C, uncured ultraviolet curable resin 41P of the first bond layer 41 is applied on the bond surface 11 of the coating 13 at an inner periphery side. The method of applying the ultraviolet curable resin 41P is not especially limited and includes an appropriate applying method such as a die coating method, an offset printing method, a screen printing method, a spraying method, and the like. The applied ultraviolet curable resin 41P is semi-cured by irradiating ultraviolet rays.

Figure 5:
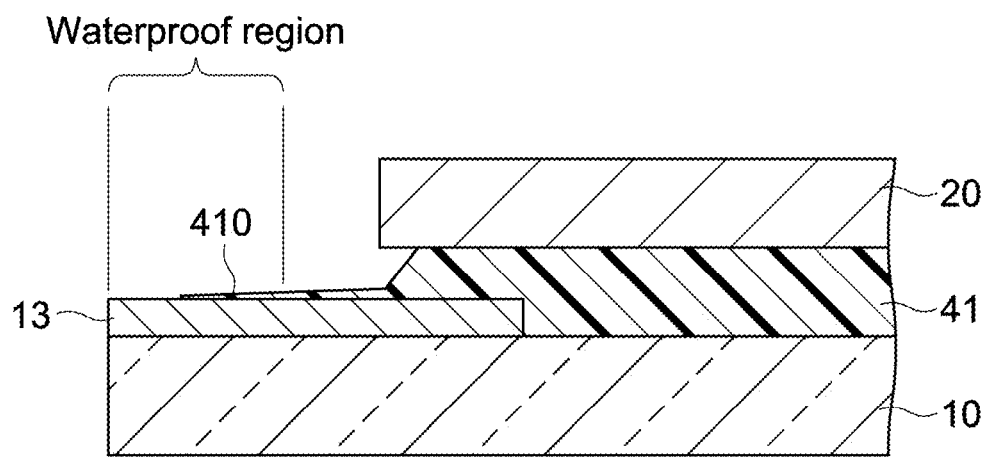
FIG. 5 is schematic cross-sectional views of a main part of an electronic apparatus according to a comparative embodiment.

In this embodiment, before applying the ultraviolet curable resin 41P, the guard 60 is arranged on the coating 13. Accordingly, an uncured component 410 seeped out from the semi-cured ultraviolet curable resin 41P does not leak out to the outer periphery side of the coating 13 as shown in FIG. 5. As shown in FIG. 4C, the guard 60 having the structural surface 61 with the wettability lower than that of the coating 13 guards wet and spread of the above-described uncured component. Thus, leakage of the uncured component to the waterproof region is effectively inhibited.

Next, as shown in FIG. 4D, the display panel 20 is bonded to the bond surface 11 of the touch panel 10 via the semi-cured ultraviolet curable resin 41P. Thereafter, the ultraviolet curable resin 41P is totally cured by irradiating ultraviolet rays from the input operation surface 12 (second surface) of the touch panel 10.

As described above, the substrate laminate 110 including the touch panel 10 and the display panel 20 is produced. Thereafter, the substrate laminate 110 is bonded to the bond surface 312 of the housing 30 (first housing 31) via the second bond layer 42 (adhesive layer) formed around an entire periphery of the outer periphery of the coating 13. The second bond layer 42 is formed of a waterproof tape, for example, and is welded between the touch panel 10 and the housing 30 by irradiating laser.

In this embodiment, since the guard 60 that guards the leakage of the uncured component seeped out from the first bond layer 41 to the waterproof region of the uncured component (outer periphery of the coating 13) is arranged on the coating 13, the degradation or the alternation of the coating 13 due to contact with the waterproof region with the uncured component. Thus, poor adhesion to the second bond layer 42 caused by the degradation or the alternation of the coating 13 can be avoided.

Second Embodiment

Figure 6:
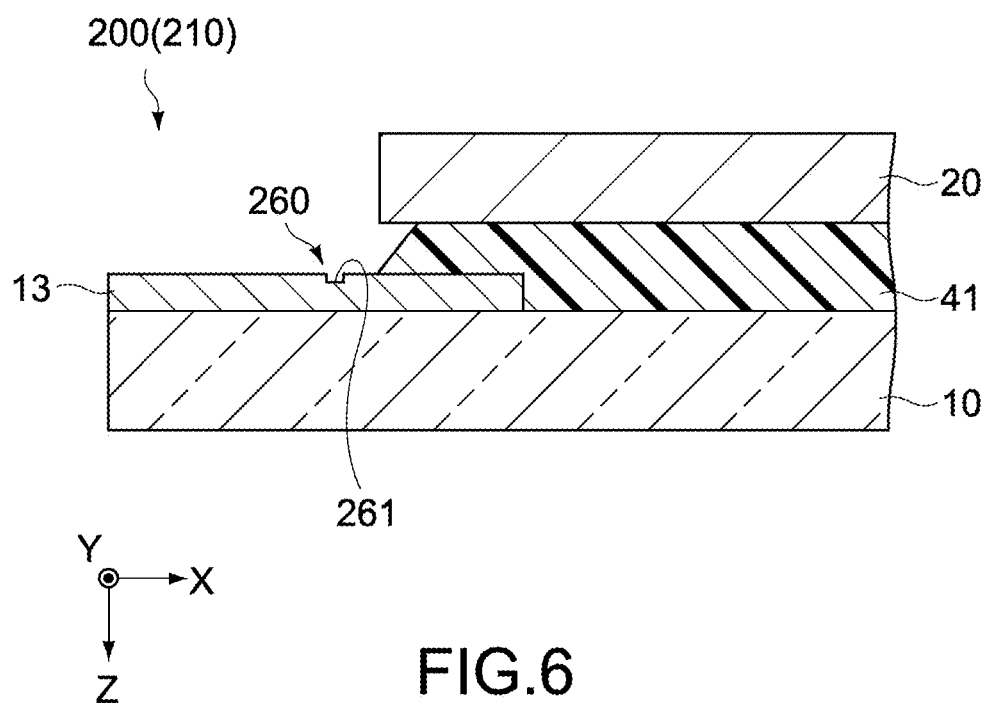
FIG. 6 is a schematic cross-sectional view showing a structure of a main part of an electronic apparatus according to a second embodiment of the present technology.

FIG. 6 is a schematic cross-sectional view showing a structure of a main part of an electronic apparatus according to a second embodiment of the present technology.

Hereinafter, the structures different from those of the first embodiment will be mainly described, the structures similar to those of the first embodiment are denoted by the similar reference signs, and thus description thereof will be omitted or simplified.

An electronic apparatus 200 or a substrate laminate 210 according to this embodiment is common to the first embodiment in that the touch panel 10, the display panel 20, the first bond layer 41, and the guard arranged on the coating 13 of the touch panel 10 are included. The structure of the guard is different from that of the first embodiment. Specifically, a guard 260 according to this embodiment includes a groove arranged on the coating 13.

The guard 260 includes a square groove having a rectangular cross section formed linearly along the Y axis direction (longitudinal direction of the touch panel 10). Note that the guard 260 is not limited to the square groove and may be formed of any appropriate cross-sectional shape such as a round groove, a V-shaped groove, and the like. In addition, the guard 260 may be formed not only of a single line of grooves but also of plural lines of grooves. Furthermore, the guard 260 is formed not only in a straight line but also in a meandering way in the Y axis direction.

An inner face 261 of the groove of the guard 260 functions as the structural surface of receiving the uncured component seeped out from the first bond layer 41 and guarding the leakage to the outer periphery of the coating 13 (waterproof region) positioned outside the guard 260. Accordingly, also in this embodiment, the actions and effects similar to those of the above-described first embodiment can be provided.

The guard 260 may be formed by processing the surface of the coating 13, e.g., machining, etching, laser processing, and the like. Alternatively, the guard 260 may be formed by partly decreasing the thickness of the coating 13.

Third Embodiment

Figure 7:
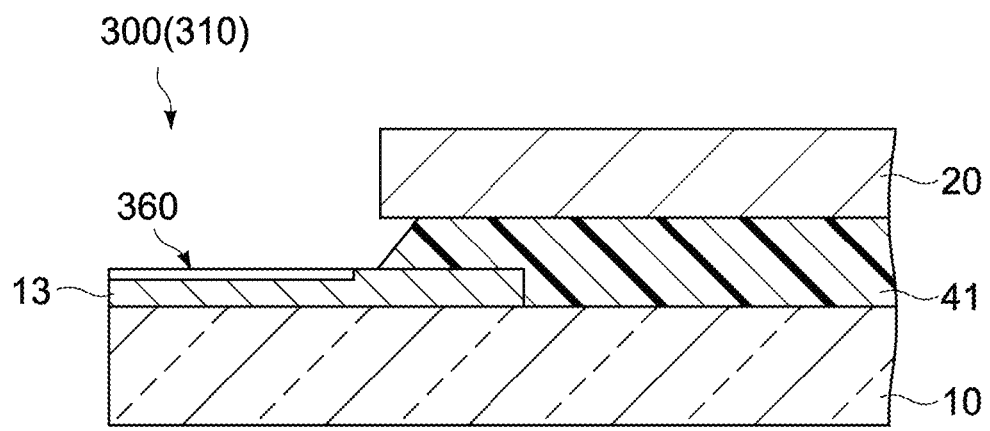
FIG. 7 is a schematic cross-sectional view showing a structure of a main part of an electronic apparatus according to a third embodiment of the present technology.

FIG. 7 is a schematic cross-sectional view showing a structure of a main part of an electronic apparatus according to a third embodiment of the present technology.

Hereinafter, the structures different from those of the first embodiment will be mainly described, the structures similar to those of the first embodiment are denoted by the similar reference signs, and thus description thereof will be omitted or simplified.

An electronic apparatus 300 or a substrate laminate 310 according to this embodiment is common to the first embodiment in that the touch panel 10, the display panel 20, the first bond layer 41, and the guard arranged on the coating 13 of the touch panel 10 are included. The structure of the guard is different from that of the first embodiment. Specifically, a guard 360 according to this embodiment includes a roughened surface arranged on the coating 13.

The guard 360 is formed around an entire periphery of the periphery (waterproof region) of the coating 13. It is certainly not limited thereto and the guard 360 may be formed partly at the position between the inner periphery and the outer periphery of the coating 13, as appropriate. Morphologies of the roughened surface of the guard 360 are not especially limited. For example, the roughened surface may be formed of a fine hair line formed along the Y axis direction or the like. Thus, the roughened surface functions as the structural surface of decreasing the wettability of the uncured component seeped out from the first bond layer 41 and guarding wetting and spreading of the uncured component on the coating 13.

In addition, since the guard 360 is formed of the roughened surface, the adhesion to the second bond layer 42 (see FIG. 2) is enhanced by an anchor effect and the bond reliability to the housing can be improved.

The method of forming the guard 360 is not especially limited and may be formed by working such as polishing, blasting, cutting using a tool, and the like, as appropriate.

Fourth Embodiment

Figure 8:
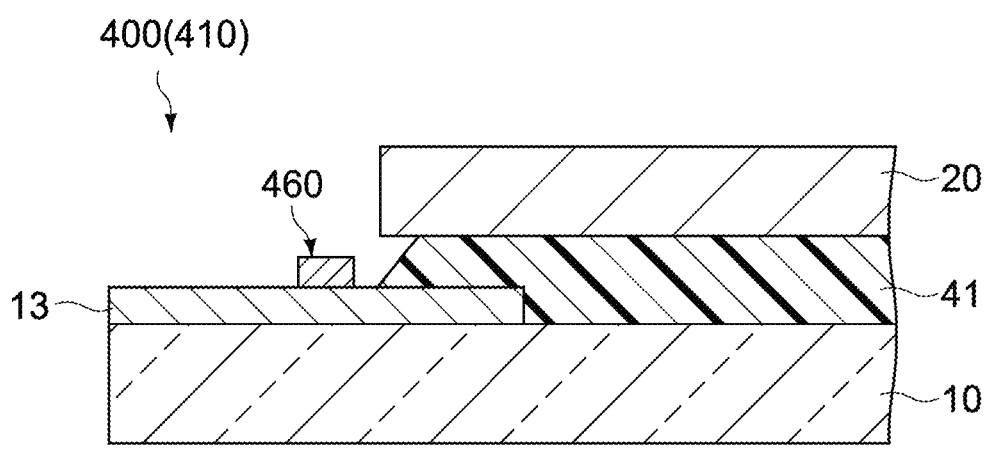
FIG. 8 is a schematic cross-sectional view showing a structure of a main part of an electronic apparatus according to a fourth embodiment of the present technology.

FIG. 8 is a schematic cross-sectional view showing a structure of a main part of an electronic apparatus according to a fourth embodiment of the present technology.

Hereinafter, the structures different from those of the first embodiment will be mainly described, the structures similar to those of the first embodiment are denoted by the similar reference signs, and thus description thereof will be omitted or simplified.

An electronic apparatus 400 or a substrate laminate 410 according to this embodiment is common to the first embodiment in that the touch panel 10, the display panel 20, the first bond layer 41, and the guard arranged on the coating 13 of the touch panel 10 are included. The structure of the guard is different from that of the first embodiment. Specifically, a guard 460 according to this embodiment includes a protrusion arranged on the coating 13.

The guard 460 includes a protrusion having a rectangular cross section formed linearly along the Y axis direction (longitudinal direction of the touch panel 10). Note that the cross-sectional shape of the guard 460 is not limited to rectangle and may be other geometric shape such as a semicircle, a triangle, and the like. In addition, the guard 460 may be formed not only of a single protrusion but also of plural protrusions. Furthermore, the guard 460 is formed not only in a straight line but also in a meandering way in the Y axis direction.

A surface of the guard 460 functions as the structural surface of damming back the uncured component seeped out from the first bond layer 41 and guarding the leakage to the outer periphery of the coating 13 (waterproof region) positioned outside the guard 460. In other words, by forming the guard 460, the wettability of the uncured component in the coating 13 can be decreased. Accordingly, also in this embodiment, the actions and effects similar to those of the above-described first embodiment can be provided.

The guard 460 may be formed of a coating, a sheet, a resist pattern, or the like that is additionally formed on the surface of the coating 13 or may be formed by partly increasing the thickness of the coating 13.

As described above, the embodiments of the present technology are described but are not limited to the above-described embodiments. It should be appreciated that various modifications and alterations may be made.

For example, in the respective above-described embodiments, as the substrate laminate, the laminate of the touch panel and the display panel is illustrated. It is not limited thereto. The present technology is also applicable to a laminate of a touch panel and a protection panel for protecting the touch panel, a laminate of a display panel and a protection panel for protecting the display panel, a laminate of a touch panel, a display panel, and a protection panel, or the like. Also, the touch sensor may be built in the display panel. Other subject laminate substrates may include a circuit substrate, a sensor substrate, or the like.

Also, in the above-described embodiments, as the light-curable resin of the first bond layer 41, the ultraviolet curable resin is illustrated. It is not limited thereto. The resin cured by light, e.g., infrared light, may be used.

Furthermore, in the above-described embodiments, as the electronic apparatus, the smartphone is illustrated. It is not limited thereto. The present technology is also applicable to an imaging device such as a digital still camera, a terminal device such as a note type PC (personal computer) and a tablet PC, and the like.

The present technology may also have the following structures.

(1) An electronic apparatus, including:
a translucent substrate having a first surface, a second surface opposite to the first surface, and a frame-shaped coating arranged at a periphery of the first surface;
a display panel having a display surface faced to the first surface;
a first bond layer that bonds the first surface and the display surface together, coats an inner periphery of the coating, and is made of a cured product of light-curable resin; and
a guard arranged on the coating along at least a part of a periphery of the first bond layer and having a structural surface with lower wettability to the light-curable resin than that of the coating.

(2) The electronic apparatus according to (1) above, in which
the guard is arranged between the inner periphery and an outer periphery of the coating.

(3) The electronic apparatus according to (2) above, in which:
a housing having a storage that stores the display panel, and a bond surface that is arranged around the storage and is faced to the outer periphery of the coating; and
a second bond layer that bonds the outer periphery of the coating and the bond surface together.

(4) The electronic apparatus according to any one of (1) to (3) above, in which
the guard includes an applied film of ink with lower wettability to the light-curable resin than that of the coating.

(5) The electronic apparatus according to (4) above, in which
the guard includes the applied film having a color different from that of the coating.

(6) The electronic apparatus according to (4) or (5) above, in which
the ink has a dyne value of 32 or more and less than 38.

(7) The electronic apparatus according to any one of (1) to (3) above, in which
the structural surface includes a groove or a roughened surface arranged on the coating.

(8) The electronic apparatus according to any one of (1) to (3) above, in which
the guard includes a protrusion arranged on the coating.

(9) The electronic apparatus according to any one of (1) to (8) above, in which
the coating includes a light shielding layer that shields a periphery of the display surface viewed from the second surface.

(10) The electronic apparatus according to any one of (1) to (9) above, in which
the translucent substrate includes a touch panel having a touch sensor.

(11) An electronic apparatus, including:
a translucent first substrate having a first bond surface;
a second substrate faced to the first bond surface;
a housing having a storage that stores the second substrate, and a second bond surface that is arranged around the storage and is faced to an outer periphery of the first bond surface;
a first bond layer that bonds the first substrate and the second substrate together and is made of a cured product of a light-curable resin;
a second bond layer that bonds the outer periphery of the first bond surface and the second bond surface together; and
a guard arranged on the first bond surface along at least a part of the periphery of the first bond layer and having a structural surface with lower wettability to the light-curable resin than that of the first bond surface.

(12) A method of producing an electronic apparatus, including:
forming a frame-shaped coating at a periphery of a first surface of a translucent substrate;
forming a guard having a structural surface with lower wettability to light-curable resin than that applied to the first surface at at least a part between an inner periphery and an outer periphery of the coating;
applying the light-curable resin on the first surface of the coating at an inner periphery side;
bonding a display panel to the first surface via the light-curable resin; and
curing the light-curable resin by irradiating the light-curable resin with light from a second surface opposite to the first surface.

(13) The method of producing an electronic apparatus according to (12) above, in which
forming the guard includes forming an applied film with lower wettability to the light-curable resin than that of the coating.

(14) The method of producing an electronic apparatus according to (13), in which
forming the guard includes forming the applied film having a color different from that of the coating.

(15) The method of producing an electronic apparatus according to any one of (12) to (14) above, further including:
bonding the translucent substrate to the housing via an adhesive layer formed around an entire periphery of the outer periphery of the coating.

(16) A substrate laminate, including:
a translucent first substrate having a bond surface;
a second substrate faced to the bond surface;
a bond layer that bonds the first substrate and the second substrate together and is made of a cured product of a light-curable resin; and
a guard arranged on the bond surface along at least a part of the periphery of the bond layer and having a structural surface with lower wettability to the light-curable resin than that of the bond layer.

(17) The substrate laminate according to (16) above, in which
the first substrate includes a coating arranged on a periphery of the bond surface,
a periphery of the bond layer coats an inner periphery of the coating, and
the guard has a structural surface with lower wettability to the light-curable resin than that of the coating and is arranged between an inner periphery and an outer periphery of the coating.

REFERENCE SIGNS LIST

10 touch panel
10s touch sensor 11 bond surface
13 coating
20 display panel
21 display surface
30 housing
41 first bond layer
42 second bond layer
60, 260, 360, 460 guard
61, 261 structural surface
100, 200, 300, 400 electronic apparatus
110, 210, 310, 410 substrate laminate

The invention claimed is:

1. An electronic apparatus, comprising:
a translucent substrate having a first surface, a second surface opposite to the first surface, and a frame-shaped coating arranged at a periphery of the first surface;
a guard arranged on the coating and having a structural surface;
a display panel having a display surface facing the first surface; and
a first bond layer that bonds the first surface and the display surface together, coats an inner periphery of the coating, and is made of a cured product of a light-curable resin;
wherein the guard is arranged on the coating along at least a part of a periphery of the first bond layer, the light-curable resin has a lower wettability to a structural surface of the guard than a wettability of the light-curable resin to the coating, and the guard has a first edge and a second edge opposite the first edge,
wherein the first bond layer has a first bonding surface in contact with the first edge of the guard, and has a second bonding surface opposite the first bonding surface and in contact with the display surface,
wherein the lower wettability to the structural surface of guard deters movement of the light-curable resin of which the first bond layer is made, such that the first bond layer is not in contact with the second edge of the guard, and such that the first bond layer does not extend beyond a periphery of the display surface in an absence of a structural guard at the periphery of the display surface.

2. The electronic apparatus according to claim 1, wherein the guard is arranged between the inner periphery and an outer periphery of the coating.

3. The electronic apparatus according to claim 2, further comprising:
a housing having a storage that stores the display panel, and a bond surface that is arranged around the storage and that includes a portion facing the outer periphery of the coating; and
a second bond layer that bonds the outer periphery of the coating and the bond surface together.

4. The electronic apparatus according to claim 1, wherein the guard includes an applied film of ink with a lower wettability to the light-curable resin than that of the coating.

5. The electronic apparatus according to claim 4, wherein the applied film of the guard has a color different from that of the coating.

6. The electronic apparatus according to claim 4, wherein the ink has a dyne value of 32 or more and less than 38.

7. The electronic apparatus according to claim 1, wherein the structural surface of the guard includes a groove or a roughened surface arranged on the coating.

8. The electronic apparatus according to claim 1, wherein the guard includes a protrusion arranged on the coating.

9. The electronic apparatus according to claim 1, wherein the coating includes a light shielding layer that shields a periphery of the display surface viewed from the second surface.

10. The electronic apparatus according to claim 1, wherein the translucent substrate includes a touch panel having a touch sensor.

11. An electronic apparatus, comprising:
a translucent first substrate having a first bond surface;
a second substrate facing the first bond surface;
a housing having a storage that stores the second substrate, and having a second bond surface that is arranged around the storage and that includes a portion facing an outer periphery of the first bond surface;
a first bond layer that bonds the first substrate and the second substrate together and is made of a cured product of a light-curable resin;
a second bond layer that bonds the outer periphery of the first bond surface and the second bond surface together; and
a guard arranged on the first bond surface along at least a part of the periphery of the first bond layer and having a structural surface with a lower wettability to the light-curable resin than that of the first bond surface,
wherein the guard has a first edge and a second edge opposite the first edge,
wherein the first bond layer has a first bonding surface in contact with the first edge of the guard, and has a second bonding surface opposite the first bonding surface and in contact with the second bond surface, and
wherein the lower wettability of the light-curable resin to the structural surface of the guard prevents movement of the light-curable resin, such that the first bond layer is not in contact with the second edge of the guard, and such that the first bond layer does not extend beyond a periphery of the second bond surface in an absence of a structural guard at the periphery of the second bond surface.

12. A method of producing an electronic apparatus, comprising:
forming a frame-shaped coating at a periphery of a first surface of a translucent substrate;
forming a guard having a structural surface with a light-curable resin has a lower wettability to the structural surface of the guard than a wettability of the light-curable resin to the coating formed on the first surface, the guard being formed at least a part between an inner periphery and an outer periphery of the coating, and the guard having a first edge and a second edge opposite the first edge;
applying the light-curable resin on the first surface of the translucent substrate at an inner-periphery side of the coating;
bonding a display panel to the first surface via the light-curable resin, the display panel including a display surface in contact with light-curable resin during the bonding; and
curing the light-curable resin by irradiating the light-curable resin with light through a second surface opposite to the first surface to produce a bond layer having a first bonding surface in contact with the first edge of the guard, and having a second bonding surface opposite the first bonding surface and in contact with the display surface,
wherein, during the curing, the lower wettability to the guard deters movement of the light-curable resin, such that the bond layer does not contact with the second edge of the guard, and such that bond layer does not extend beyond a periphery of the display surface in an absence of a structural guard at the periphery of the display surface.

13. The method of producing the electronic apparatus according to claim 12, wherein the forming of the guard includes forming an applied film with the lower wettability to the light-curable resin than that of the coating.

14. The method of producing the electronic apparatus according to claim 13, wherein the applied film has a color different from that of the coating.

15. The method of producing the electronic apparatus according to claim 12, further comprising:
bonding the translucent substrate to a housing via an adhesive layer formed around an entire periphery of the outer periphery of the coating.

16. A substrate laminate, comprising:
a translucent first substrate having a first bond surface;
a second substrate having a second bond surface facing the first bond surface;
a bond layer that bonds the first substrate and the second substrate together and is made of a cured product of a light-curable resin; and
a guard arranged on the first bond surface along at least a part of a periphery of the first bond surface and having a structural surface such that the light-curable resin has a lower wettability to the structural surface of the guard than a wettability of the light-curable resin to the first bond surface,
wherein the guard has a first edge and a second edge opposite the first edge,
wherein the bond layer has a first bonding surface in contact with the first edge of the guard, and has a second bonding surface opposite the first bonding surface and in contact with the second bond surface, and
wherein the lower wettability of the light-curable resin to the structural surface of the guard prevents movement of the light-curable resin, such that the bond layer is not in contact with the second edge of the guard, and such that the bond layer does not extend beyond a periphery of the second bond surface in an absence of a structural guard at the periphery of the second bond surface.

17. The substrate laminate according to claim 16, wherein
the first substrate includes a coating arranged on a periphery of the first bond surface,
a periphery of the bond layer coats an inner periphery of the coating,
the light-curable resin has a lower wettability to the structural surface of the guard than a wettability of the light-curable resin to the coating, and
the guard is arranged between an inner periphery and an outer periphery of the coating.

* * * * *